United States Patent [19]

Gotjé et al.

[11] 4,371,848

[45] Feb. 1, 1983

[54] MAGNETRON HAVING A FILTER ON THE OUTPUT PROBE

[75] Inventors: Egbert B. G. W. Gotjé; Franciscus N. A. Kerstens, both of Eindhoven, Netherlands

[73] Assignee: U.S. Philips Corporation, New York, N.Y.

[21] Appl. No.: 191,541

[22] Filed: Sep. 29, 1980

[30] Foreign Application Priority Data

Oct. 15, 1979 [NL] Netherlands ........................ 7907593

[51] Int. Cl.[3] ........................ H01J 23/32; H03B 9/10

[52] U.S. Cl. .................................... 331/91; 315/39.53

[58] Field of Search ................. 331/86, 91; 315/39.51, 315/39.53; 333/202-204, 206, 207, 212

[56] References Cited

U.S. PATENT DOCUMENTS 3,849,737 11/1974 Oguro ................................. 331/86

4,207,496 6/1980 Nakai .............................. 315/39.53

OTHER PUBLICATIONS

Bates, "Design of Microstrip Spur-line Band-stop Filters", Microwaves, Optics and Acoustics, Nov. 1977, vol. 1, pp. 209-214.

*Primary Examiner*—Siegfried H. Grimm

*Attorney, Agent, or Firm*—Robert J. Kraus

[57] ABSTRACT

A simple but effective filter attenuating one or more frequencies other than the fundamental frequency of a magnetron is provided in the magnetron. The filter comprises one or more stubs each of which extends along one side of an output probe connected to an anode vane of the magnetron. Each stub forms a slot which has an effective electrical length of a quarter wavelength at the frequency to be attenuated by the filter. The probe may be a metal strip and the stub, may be a lug formed by cutting in the strip a mainly longitudinal slot which opens into a side edge of the strip.

5 Claims, 6 Drawing Figures

MAGNETRON HAVING A FILTER ON THE OUTPUT PROBE

BACKGROUND OF THE INVENTION

The invention relates to a magnetron comprising an anode housing having anode vanes extending internally from the inner wall of the anode housing, an output portion, and a probe extending in the output portion and connected to at least one of the anode vanes, wherein the probe has a filter to attenuate a frequency other than the fundamental frequency of the magnetron.

Such a magnetron is disclosed in U.S. Pat. No. 3,849,737 and is used in particular in microwave ovens for food preparation and the like. In this magnetron the filter comprises a metal cup-shaped body which coaxially surrounds the aerial probe and the bottom of which is connected to the aerial probe. The manufacture of this type of filter and the connection thereof in the magnetron make the manufacture of the magnetron complicated, which is a drawback in series production and increases the production costs.

SUMMARY OF THE INVENTION

It is an object of the invention to provide a magnetron in which a filter to attenuate a frequency other than the fundamental frequency is obtained with simple means.

According to the invention, the filter comprises one or more stubs each of which extends along one side of the probe such that a slot is formed having an effective electrical length of approximately a quarter of the wavelength associated with a frequency to be attenuated by the filter.

A filter thus obtained has proved not only to be particularly effective but in addition may have a particularly simple construction. The required component(s) of the filter are simple to manufacture.

It is to be noted that the use of band stop filters for microwave frequencies is known per se (Electronic Engineering, Vol. 50, No. 604, April 1978, pp. 39–41). However, these known filters relate to micro-strip constructions which are used in transmission systems in the field of low-power signal handling.

The filter may comprise two stubs which are symmetrical about the center line of the probe. Such a symmetrical construction of the filter increases the attenuation of an undesired frequency.

Alternatively, the filter may comprise two stubs disposed on opposite sides of the probe and forming two slots of different effective electrical lengths, respectively.

If the filter comprises one or more initially separate elements, the connection thereof in the magnetron can be realized with a simple and rapid operation, for example, spot welding.

Alternatively the probe may be an elongate metal strip in which the stub has been formed from the strip.

This feature may be present in embodiments having the features of either of the two preceding paragraphs. The advantage of this construction is that no separate components are used for the filter and consequently no separate operation to connect components is necessary. In such an embodiment, each stub consists of a lug formed by cutting in the strip a slot which opens into an edge of the strip and has an effective electrical length $l_n$ approximately one fourth of the wavelength associated with a frequency $f_n$ to be attenuated.

BRIEF DESCRIPTION OF THE DRAWING

Embodiments of the invention will now be described in greater detail with reference to the accompanying diagrammatic drawing, in which.

DESCRIPTION OF THE PREFERRED EMBODIMENTS

Figure 1:
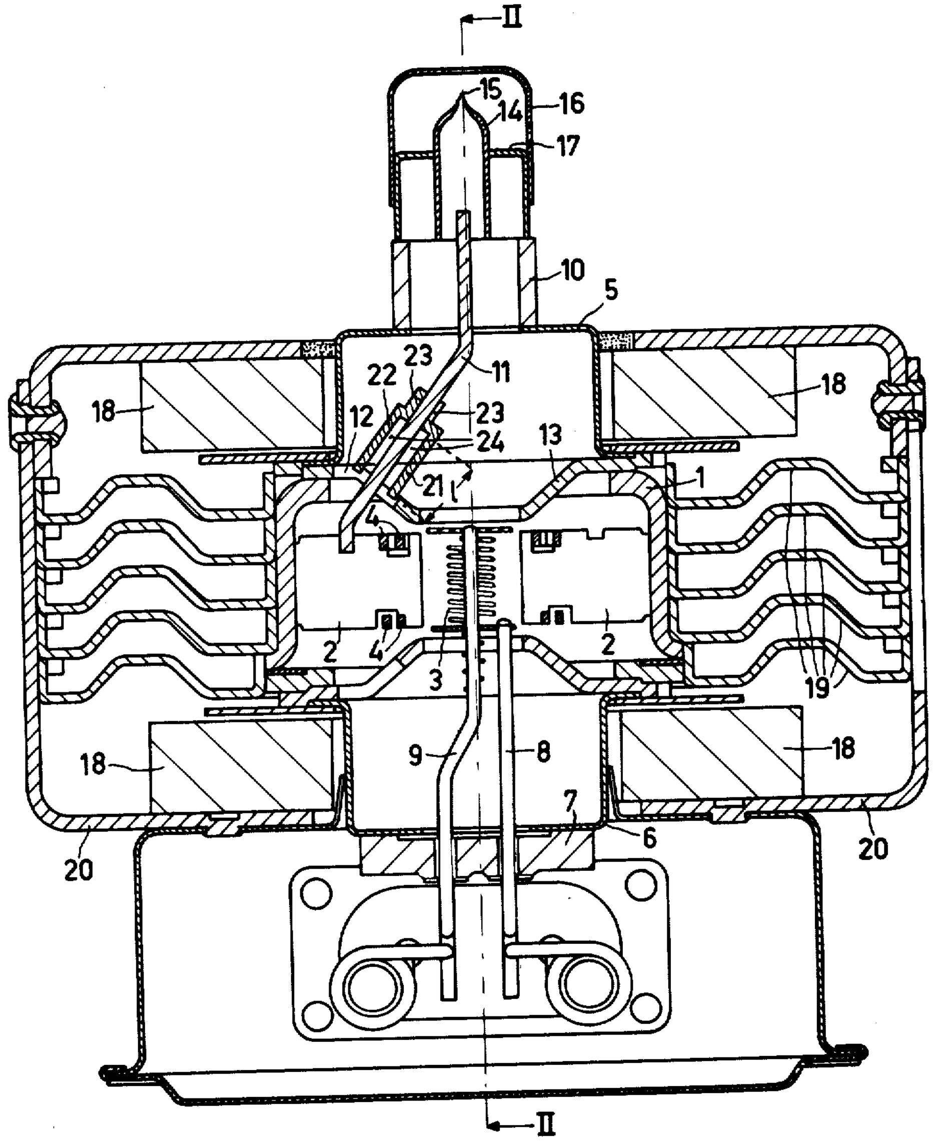
FIG. 1 is an axial sectional view of a magnetron embodying the invention.
Figure 2:
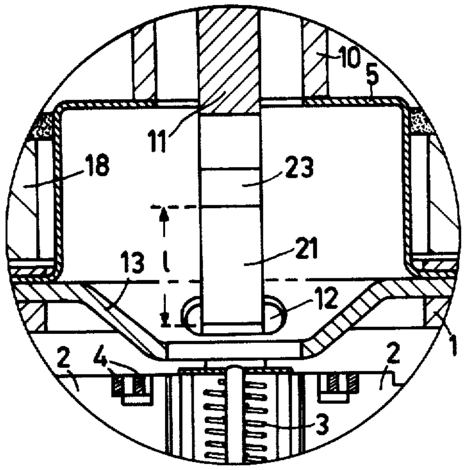
FIG. 2 is a sectional view, taken on the line II—II of FIG. 1; of a part of the magnetron, showing a filter therein.

FIGS. 1 and 2 show a magnetron having a copper anode housing 1 and a number of copper anode vanes 2 extending from the inner wall of the anode housing 1 to a helical cathode 3. Near the cathode 3 the anode vanes 2 are connected alternately on their upper and lower edges by conductive straps 4. Metal caps 5 and 6 bound the end spaces of the magnetron. The end space bounded by cap 6 is closed by a ceramic plate 7 in which cathode supply conductors 8 and 9 are incorporated. A cylindrical ceramic window 10 adjoins the end space bounded by cap 5. A probe comprises a strip 11 which passes through an aperture 12 in an internal magnetic poleshoe 13. The strip 11 is connected at its lower end to one of the anode vanes 2. At its upper end the aerial strip 11 may extend freely in the output portion of the magnetron or it may, as more clearly shown in FIG. 6 be connected to a metal exhaust tube 14. The pinched-off end 15 of the exhaust tube 14 is surrounded by a metal screening cap 16 which is connected electrically to the exhaust tube 14 via a metal cap 17. The exhaust tube 14 is, as more clearly shown in FIG. 6, connected to the strip 11. The magnetron further comprises axially-magnetized magnets 18, cooling fins 19 and a magnet yoke 20 which also forms the cooler housing. In use, the output portion of the magnetron formed by the window 10 and the metal cap 16 is located in a waveguide or resonant cavity (in this case an oven cavity). The high frequency energy generated by the magnetron is radiated into the waveguide or resonant cavity via the output portion.

In addition to the fundamental oscillation produced by the magnetron, harmonics of the fundamental oscillation are generated. In magnetrons for cooking purposes the fundamental oscillation has a frequency of approximately 2450 MHz. The radiation of the fundamental oscillation from the oven cavity can be sufficiently restricted. However, it is very difficult to restrict sufficiently the radiation of the second and possibly higher harmonics from the oven cavity. For this reason the magnetron itself is provided with a filter to attenuate radiation of energy having a frequency other than the fundamental frequency. In FIG. 1 such a filter comprises two stubs formed by two metal strips 21 and 22 which are connected to the aerial strip 11 by spot welding 23. The strips 21 and 22 each extend along one side of the aerial strip 11 into or near the aperture 12 and each form a slot 24 having a length "l" approximately equal to a quarter of the wavelength associated with the frequency to be attenuated by the filter. It is possible to form the filter by means of a single strip. The symmetrical construction shown, however, is more effective than that with a single strip. It is alternatively possible for the strips 21 and 22 to have different lengths. For example, the strip 21 may form a slot having a length $l = l_1$ and the strip 22 may form a slot having a length $l = l_2$, where $l_1$ is approximately a quarter of the wavelength associated with a frequency $f_1$ to be attenuated and $l_2$ is approximately a quarter of the wavelength associated with a frequency $f_2$ to be attenuated.

Figure 3:
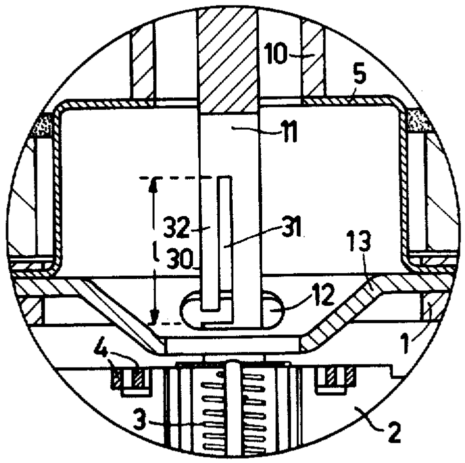
FIG. 3 to FIG. 6 are sectional views, analogous to that of FIG. 2, of various other filters in embodiments of the invention.
Figure 4:
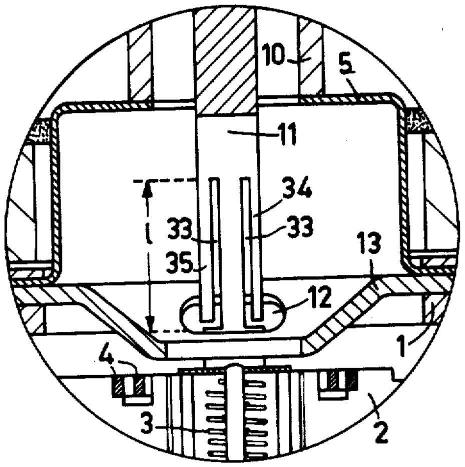
Figure 5:
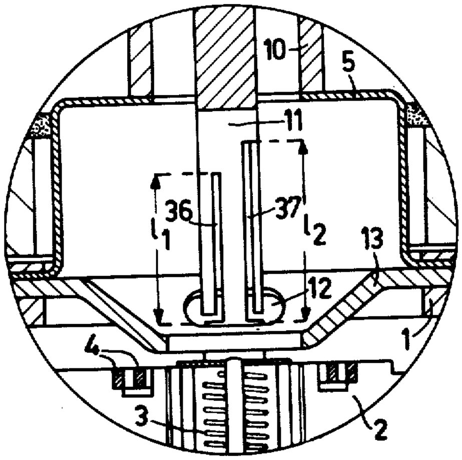

FIGS. 3 to 6 are views of various embodiments of the invention in which a part of the magnetron is shown in a sectional view analogous to that of FIG. 2. For clarity and simplicity, corresponding components of the magnetron are referred to by the same reference numerals as used in FIG. 2. In FIG. 3, a mainly longitudinal slot 31 opening into an edge 30 of the aerial is made in the aerial strip 11 so that a lug 32 is formed. The length "l" of the slot 31 is approximately a quarter of the wavelength associated with a frequency to be attenuated. A symmetrical construction of this filter is shown in FIG. 4. Two slots 33 of length "l" are provided in the aerial strip 11 and each open into an edge of the aerial strip 11 so that two lugs 34 and 35 are formed. A modification of this embodiment is shown in FIG. 5. Slots 36 and 37 therein have lengths "$l_1$" and "$l_2$", where $l_1$ is approximately a quarter of the wavelength associated with a first frequency $f_1$ to be attenuated and $l_2$ is approximately a quarter of the wavelength associated with a second frequency $f_2$ to be attenuated. In a concrete example the fundamental oscillation of the magnetron has a frequency of 2450 MHz; $f_1 = 4900$ MHz (second harmonic) and $f_2 = 4300$ MHz. The frequency $f_2$ is, for example, the frequency of the so-called $\pi - 1$ mode generated by the magnetron in addition to the fundamental oscillation.

Figure 6:
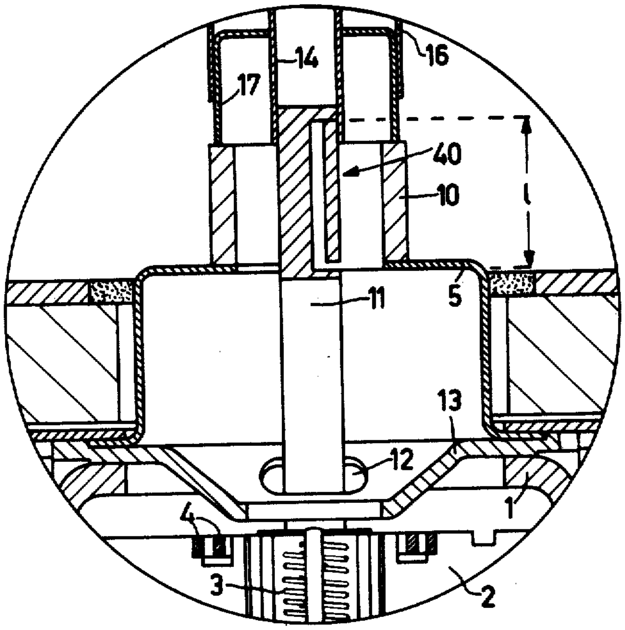

FIG. 6 shows an embodiment differing from the FIG. 3 embodiment in that the filter 40 is not situated near the aperture 12 in the poleshoe 13 but is accommodated in the output portion of the magnetron. The modifications described with reference to FIGS. 4 and 5 are also possible in this case.

Further embodiments are possible within the scope of the invention. For example, the filter may alternatively comprise a substantially U-shaped element punched from a metal sheet, the two limbs of which extend on opposite sides of the aerial strip and forming slots having a length l as stated above, the connecting piece of the limbs being welded to a flat broad surface of the aerial strip.

What is claimed is:

1. A magnetron comprising:
   (a) an anode housing having vanes extending internally from an inner wall of the housing;
   (b) a cathode;
   (c) an output portion; and
   (d) a probe connected to at least one of the anode vanes and extending into the output portion, said probe including a filter for attenuating a frequency other than the fundamental frequency of the magnetron, said filter comprising at least one stub extending along one side of the probe and forming a slot having an effective length of approximately one quarter of the wavelength associated with frequency to be attenuated by the filter.

2. A magnetron as claimed in claim 1, characterized in that the filter comprises two of said stubs which are symmetrical about the centre line of the probe.

3. A magnetron as claimed in claim 1, characterized in that the filter comprises two of said stubs, each on an opposite side of the probe, forming two slots of different lengths.

4. A magnetron as claimed in claim 1, 2 or 3, characterized in that the probe is an elongate metal strip having at least one of said stubs formed therefrom.

5. A magnetron as claimed in claim 4, characterized in that said stub formed from the strip consists of a lug formed by cutting in the strip a slot which opens into an edge of the strip and has an effective length $l_n$ equal to approximately one fourth of the wavelength associated with a frequency $f_n$ to be attenuated.

* * * * *